United States Patent [19]
Lee

[11] Patent Number: 5,552,341
[45] Date of Patent: Sep. 3, 1996

[54] SEMICONDUCTOR DEVICE AND METHOD FOR MANUFACTURING THE SAME

[75] Inventor: Sang-in Lee, Suwon, Rep. of Korea

[73] Assignee: Samsung Electronics Co., Ltd., Suwon, Rep. of Korea

[21] Appl. No.: 164,920

[22] Filed: Dec. 10, 1993

[30] Foreign Application Priority Data

Dec. 10, 1992 [KR] Rep. of Korea ............... 92-23807

[51] Int. Cl.⁶ ............................................. H01L 21/441
[52] U.S. Cl. ..................... 437/192; 437/190; 437/194; 437/228; 257/740; 257/751
[58] Field of Search ............................ 437/190, 228, 437/192; 257/751

[56] References Cited

U.S. PATENT DOCUMENTS

| | | | |
|---|---|---|---|
| 4,674,176 | 6/1987 | Tuckerman | 427/53.1 |
| 4,829,363 | 5/1989 | Thomas et al. | 257/751 |
| 4,897,709 | 1/1990 | Yokoyama et al. | 437/197 |

FOREIGN PATENT DOCUMENTS 0251139  10/1990  Japan ........................ 437/190

OTHER PUBLICATIONS

Lin, Cobalt Silicide Interconnection from a Si/W/Co Trilayer Structure, J. Electrochem. Soc., vol. 136, No. 1, Jan. 1989, pp. 258–262.

Sze, VLSI Technology, 2nd Ed., McGraw–Hill, pp. 233–235, 1988.

Vossen, Preparation of surfaces for high quality interface formation, J. Vac. Sci. Tech. A 2(2), Apr. 1984, pp. 212–215.

*Primary Examiner*—R. Bruce Breneman
*Assistant Examiner*—Anita Alanko
*Attorney, Agent, or Firm*—Cushman, Darby & Cushman L.L.P.

[57] ABSTRACT

A semiconductor device and manufacturing method thereof having a diffusion barrier layer formed on a semiconductor wafer. The diffusion barrier layer has a surface region provided with a silylation layer which is formed on the diffusion barrier layer by a plasma process using silicon hydride or by a reactive sputtering method using $SiH_4$. When a metal layer is formed on the silylation layer, the wettability between the diffusion barrier layer and the metal is enhanced and large grains are formed, thereby increasing the step coverage for the contact hole of the metal layer or for the via hole. Additionally, when heat treatment is performed after the metal layer is formed on the silylation layer, the reflow characteristic of the metal layer becomes good, to thereby facilitate the filling of the contact hole or the via hole. When the wiring layer is thus formed, metal wiring having good reliability can be obtained and a subsequent scintering process is rendered unnecessary.

31 Claims, 6 Drawing Sheets

SEMICONDUCTOR DEVICE AND METHOD FOR MANUFACTURING THE SAME

BACKGROUND OF THE INVENTION

The present invention relates to a semiconductor device and a method for manufacturing the same, and more particularly, to a semiconductor device which includes a wiring layer and a method for manufacturing the same.

In less dense conventional semiconductor devices, metal step coverage has not been a serious problem. However, as integration density in semiconductor devices has increased, the diameters of contact holes have become significantly smaller, to half micron dimensions, while impurity-doped regions formed in the surface of the semiconductor wafer have become much shallower. Accordingly, improvement in the conventional method for forming a wiring layer, using aluminum (Al), is needed since filling contact holes of 1 μm or less is difficult and the reliability of the metal wiring layer is deteriorated due to the formation of voids. The wiring method used in semiconductor devices has become very important in semiconductor manufacturing processes since it is an important factor in determining the speed, yield and reliability of the semiconductor device.

To solve such problems as void formation, caused by poor step coverage of the sputtered aluminum and high aspect ratios of contact holes, a method for filling up the contact hole with molten aluminum has been proposed. For example, Japanese Laid-open Publication No. 61-132848 (by Yukiyasu Sugano et al.), Japanese Laid-open Publication No. 63-99546 (by Shinpei Iijima et al.) and Japanese Laid-open Publication No. 62-109341 (by Misahiro Shimizu et al.) disclose melting methods. According to the above publications, the contact hole is filled by the steps of depositing aluminum or an aluminum alloy on a semiconductor wafer, heating the aluminum beyond its melting temperature, and then reflowing the liquid aluminum to fill the contact holes.

According to the above method, the semiconductor wafer has to be disposed horizontally so as to allow proper filling of the contact hole with the flowing molten aluminum. The liquid metal layer will seek a lower surface tension and thus, may shrink or warp when this layer solidifies, thereby exposing the underlying semiconductor material. Further, the heat treatment temperature cannot be precisely controlled, and, therefore, the desired results are difficult to reproduce. Moreover, the remaining areas of the metal layer besides the contact hole become rough, which causes difficulty in subsequent photolithography processes.

A metal wiring method for eliminating poor step coverage is disclosed in U.S. Pat. No. 4,970,176 (by Tracy et al.). According to this patent, a thick metal layer having a predetermined thickness is deposited on a semiconductor wafer at a low temperature (below approximately 200° C.). Then, a remaining and relatively thin metal layer is deposited on the semiconductor wafer while the temperature is increased to approximately 400° C. to 500° C. The thus-deposited metal layer improves the step coverage of a metal layer which will be deposited later, by means of grain growth, re-crystallization and bulk diffusion.

However, even in this method, a contact hole whose diameter is 1 μm or less cannot be completely filled with aluminum or an aluminum alloy.

Meanwhile, Hisako Ono et al. have shown that when the semiconductor wafer temperature is above 500° C., the liquidity of Al—Si suddenly increases. A method of filling the contact hole by depositing Al—Si film at a temperature of 500°–550° C. was disclosed in 1990 VMIC Conference, Jun. 11–12, pp.76–82.

Additionally, Yoda Dakashi et al. have suggested a method for filling up the contact hole by depositing metal at a temperature of 500°–550° C. (European Patent Application No. 90104814.0 corresponding to Japanese Laid-open Publication No. 02-239665). According to the Yoda Dakashi method, the contact hole can be completely filled with a metal. However, there is a high probability that the Al—Si film has a strong resistance against electron migration but a weak resistance against stress migration. In addition to this, the Si included in the Al film is crystallized at the interfaces between Al—Si grains. Thus, it becomes necessary to completely remove the Al—Si film at areas other than the contact hole area, and the wiring is formed after depositing an Al—Si—Cu film.

Additionally, C. S. Park et al. (which includes the present inventor) have disclosed a method which comprises the steps of depositing an aluminum alloy at a low temperature of 100° C. or below, performing a heat treatment for three minutes at a temperature of approximately 550° C., i.e., a temperature below the melting point, and then completing the filling of the contact hole (see Proceedings of 1991 VMIC Conference, Jun. 11–12, pp.326–328). This method is included in U.S. patent application Ser. No. 07/897,294 filed on Aug. 24, 1992, now U.S. Pat. No. 5,318,923 (as a continuation-in-part of U.S. patent application Ser. No. 07/585,218 entitled "A Method for Forming a Metal Layer in a Semiconductor Device," filed on Sep. 19, 1990, now abandoned). The aluminum deposited at low temperature is not melted during heat treatment at 550° C., but migrates into the contact hole, thereby completely filling the contact hole.

According to the C. S. Park method, a 0.8 μm contact hole having an aspect ratio of approximately 1.0 can be completely filled by performing heat treatment even after aluminum is deposited at a low temperature (100° C. or less) to a thickness of approximately 500 Å. This method does not require an etching process to be performed, as in the Yoda Dakashi method. Because of these advantages, the C. S. Park method for filling the contact hole is attracting much interest in the relevant fields.

Pure Al has been used for forming metal wiring layer in the early development of semiconductor devices. However, Al—1%Si, i.e., aluminum over-saturated with silicon, has now been widely used as metal wiring layer material since the Al layer absorbs silicon atoms from the silicon substrate and generates junction spiking as the temperature increases in the sintering step.

However, when the semiconductor device wiring is formed using the Al—1%Si, silicon from an Al film crystallized during heat treatment is performed at a temperature of approximately 450° C. or higher, thereby forming Si precipitates. The silicon grain formation is accomplished by an epitaxial growth ill the contact hole, to thereby form a Si-nodule. As a result, the Si precipitate or Si-nodule increases the wiring resistance or the contact resistance.

It is presently known that a diffusion barrier layer can be formed between the wiring layer and the silicon wafer or an insulating layer, so as to prevent Al spiking, Si precipitates and Si-nodule formation caused by the above-mentioned reaction between the metal wiring layer and the silicon wafer. For example, U.S. Pat. No. 4,897,709 (by Yokoyama et al.) describes a method for forming a nitride titanium film as a diffusion barrier layer on the inner walls of the contact hole. Additionally, in Japanese Laid-open Publication No.

61-183942, a method is described for forming a barrier layer which comprises the steps of forming a refractory metal layer by depositing a metal such as Mo, W, Ti or Ta, forming a titanium nitride layer on the refractory metal layer and heat-treating the double layer which consists of the refractory metal layer and the nitride titanium layer to thereby form a refractory metal silicide layer consisting of thermally stable compounds at the inter surface of the refractory metal layer and semiconductor substrate. Thus, the barrier characteristic is improved. This heat treatment of the diffusion barrier layer is performed by an annealing process under a nitrogen atmosphere. When the diffusion barrier layer does not undergo the annealing process, junction spiking occurs in a subsequent sintering step after Al sputtering or while sputtering Al or an Al alloy at a temperature above 450° C., which is undesirable.

Additionally, Hagira Masafumi has suggested a method wherein a TiN layer, as a barrier layer, is heat-treated and then the barrier layer is implanted with $O_2$ or silicon in order to improve the wettability between the barrier metal and the Al wiring and to improve the quality and yield of the wiring (Japanese Laid-open Publication No. 2-26052).

Additionally, a method for improving a barrier characteristic upon forming a diffusion barrier layer is known. This method comprises a step of forming a TiN layer, heat-treating and then, forming a TiN layer again.

Besides the method for preventing Al spiking or Si precipitate crystallization by improving the characteristic of a diffusion barrier layer as described above, a method for preventing Al spiking or the Si formation precipitates by forming a composite layer having various compositions, such as an Al wiring layers, has also been suggested.

For example, a method for preventing Si-precipitates in a sintering process when a wiring layer is formed is disclosed in Japanese Laid-open Publication No. 2-159065 (by Michiichi Masmoto). This method comprises the steps of forming an Al—Si film and then forming a pure Al layer thereon, thereby preventing Si-precipitates in the sintering process. Further, U.S. patent application Ser. Nos. 07/828,458 (filed on Jan. 31, 1992 and now U.S. Pat. No. 5,266,521) and 07/910,894 (filed on Jul. 8, 1992 and now U.S. Pat. No. 5,355,020) by S. I. Lee (the present inventor) et al. disclose a method for forming a composite layer so as to prevent the crystallization of Si precipitates generated when the contact hole is filled by depositing Al at a low temperature and heat-treating at a high temperature below the melting point according to the C. S. Park et al. method. According to the method described in U.S. patent application Ser. No. 07/828,458, now U.S. Pat. No. 5,266,521, pure Al is deposited at a low temperature to a thickness of approximately one third of a predetermined thickness of a wiring layer so as to form a first metal layer. Then, the first metal layer is heat-treated at a temperature of approximately 550° C., to thereby fill the contact hole. Then, an Al alloy which includes a Si component is deposited at a temperature of approximately 350° C. so as to form a second metal layer. Thus, by forming a composite layer, the first metal layer which does not include the Si component absorbs the silicon from the second metal layer in the subsequent sintering process, thereby preventing the crystallization of Si precipitates. According to the method of U.S. patent application Ser. No. 07/910,894, now U.S. Pat. No. 5,355,020, Al alloy including a Si component is first deposited and then pure Al or an Al alloy is deposited, thereby forming a composite layer. Then, this layer is heat-treated so as to fill the contact hole. Then, an Al alloy without Si is additionally deposited so as to have a predetermined thickness, which then is patterned, to thereby complete a wiring layer.

Generally, in order to form a metal layer after forming a diffusion barrier layer, the wafer is exposed to the atmosphere since the wafer should be transferred to sputtering equipment to form the metal layer.

At this time, oxidation occurs at the interfaces of the grains or on the surface portion of the diffusion barrier layer, and the mobility of aluminum atoms on the oxidized diffusion barrier layer is decreased. When an Al—1%Si—0.5% Cu alloy is deposited to a thickness of 6,000 Å at room temperature, formed grains are small, i.e., approximately 0.2 µm.

Meanwhile, large grains of up to approximately 1 µm are formed on the diffusion barrier layer unexposed to the atmosphere. Aluminum reacts with the diffusion barrier layer during a heat-treating step at a high temperature or when depositing an Al film by sputtering at a high temperature, to thereby make the surface of the Al film very rough and deteriorate surface reflectivity thereof. As a result, subsequent photolithography processes are difficult to perform.

In general, a titanium nitride (TiN) layer or TiW (or TiW(N)) layer is used as the diffusion barrier layer. Such layers have micro-structured defects or grain boundaries which cannot prevent silicon or Al diffusion at the grain boundary when forming a thin film of the diffusion barrier layer. A method for blocking a diffusion path in the grain boundary according to an "oxygen stuffing" method has been suggested. When the diffusion barrier layer is exposed to a $N_2$ annealing process or to the atmosphere, a small amount of oxygen is mixed into the barrier layer, to thereby increase a diffusion barrier effect. This is called a "stuffing effect."

Generally, when TiN is deposited and exposed to the atmosphere, a stuffing effect occurs due to oxygen in the atmosphere. The method of the Hagita patent also oxygenates the surface of the diffusion barrier layer, thereby improving the characteristics of the barrier metal.

However, contact resistance can be increased when Ti or TiN is deposited to form a barrier layer which is then exposed to the atmosphere, when TiN is deposited while introducing the oxygen, or when the barrier layer is annealed under a nitrogen atmosphere wherein oxygen is introduced.

The barrier characteristic of TiN film can be changed depending on such conditions as the exposure time to the atmosphere, the amount of oxygen introduced in during deposition, the amount of oxygen introduced during annealing, and the annealing temperature. Annealing the barrier metal is best performed at a temperature of approximately 450° C. under a $N_2$ atmosphere for 30 to 60 minutes.

FIG. 1 is a cross-sectional view showing an oxide layer formed on a surface of the diffusion barrier layer when the vacuum is broken after forming the diffusion barrier layer.

FIG. 2 is a cross-sectional view showing the oxide layer formed on the surface of the diffusion barrier layer after its formation and the $N_2$ annealing thereof, showing an improved diffusion barrier characteristic.

FIG. 3 is a sectional view showing a diffusion barrier layer obtained by forming a first diffusion barrier layer and then forming a second diffusion barrier layer on the first diffusion barrier layer after ion-implanting the first diffusion barrier layer or nitrogen annealing the first diffusion barrier layer. Referring to FIG. 3, as a middle layer, an amorphous layer formed by ion-implantation or an oxide layer formed by nitrogen annealing exists between the first diffusion barrier layer and the second diffusion barrier layer.

After the diffusion barrier layer is formed, and when the Al wiring layer is formed according to the C. S. Park method or the high-temperature sputtering method, the diffusion barrier layer is exposed to the atmosphere. Therefore, an oxide exists on the surface of a diffusion barrier layer and on the grain boundary thereof, thereby deteriorating the wettability between the diffusion barrier layer and the Al wiring layer. As a result, the size of the grain formed in the early step of the deposition becomes smaller, and the reliability the wiring layer is lowered due to a poor profile of the deposited Al, void formation while filling the contact hole, or a poor profile of the Al layer during heat treatment.

FIGS. 4, 5 and 6 show a poor wiring layer which can be generated when Al is deposited on a conventional diffusion barrier layer to form a metal layer and then the metal layer is heat-treated to fill the contact hole.

Referring to FIGS. 4–6, reference numeral 1 denotes a semiconductor substrate, reference numeral 2 denotes an impurity doped region, reference numeral 3 denotes an insulating film (BPSG film), reference numeral 4 denotes a diffusion barrier layer, and reference numeral 6 indicates an Al alloy metal layer. FIG. 4 shows a discontinuity 7 of the Al alloy metal generated on sidewalls of the contact hole due to poor wettability between the diffusion barrier layer 4 and the Al when performing high-temperature sputtering or Al alloy metal layer 6 deposition. FIG. 5 shows a void 8 which exists in the contact hole when the Al alloy metal is deposited and then heat-treated in vacuum or when the contact hole is filled according to the high-temperature sputtering method. FIG. 6 shows a poor profile 9 of the Al alloy metal layer 6 generated when Al is sputtered at a high temperature or when the Al alloy metal layer 6 is heat-treated in a vacuum after Al deposition.

Hiroshi Nishimura et al. have suggested that a via hole having a diameter of 0.5 μm and an aspect ratio of 1.6 can be filled by depositing Ti prior to Al sputtering and by successively performing high-temperature sputtering of Al at a temperature of approximately 500° C. ("Reliable Submicron Vias Using Aluminum Alloy High Temperature Sputter Filling" pp. 170–176; 1991 VMIC Conference). According to Hiroshi et al., the filling of the contact hole is caused by the reaction between Al and Ti. However, when $Al_3Ti$ is formed, the solid solubility of silicon increases to approximately 15% by weight at a temperature of 450° C. when sintering is performed in a subsequent process. Accordingly, when $Al_3Ti$ is formed in the contact hole, the possibility of generating Al spiking increases by the reaction the Al layer with the substrate due to the reaction between $Al_3Ti$ and Si. Further, the Al surface becomes very rough as the Al and Ti react, when the vacuum heat-treatment is performed according to the C. S. Park method after deposition process, or when sputtering Al at a high temperature, thereby lowering reflectivity and creating difficulties in subsequent photolithography processes.

Additionally, when depositing a metal including no Si components in order to prevent the crystallization of Si precipitates, Al spiking occurs by the reaction between the Al and the substrate where a poor diffusion barrier layer exists. FIG. 7 is a sectional view showing Al spiking generated from the conventional techniques. Referring to FIG. 7, reference numeral 1 denotes a semiconductor substrate, reference numeral 2 indicates an impurity doped region, reference numeral 3 denotes an insulating film (BPSG film), reference numeral 4 denotes a diffusion barrier layer, reference numeral 6 denotes an Al alloy metal layer and reference numeral 10 denotes Al spiking.

It is desirable to form an oxide on the surface of the diffusion barrier layer and in the grain boundary thereof, in order to improve the characteristics of the diffusion barrier layer in the contact hole. However, this oxide may deteriorate the wettability of the diffusion barrier layer and the Al so that a void may be formed in the contact hole, or a metal layer which has a poor profile during heat treatment may be formed, which thereby deteriorates the reliability of the wiring layer of a semiconductor device.

In addition, when the composite layer is formed according to the methods disclosed in the above-mentioned U.S. patent application Ser. Nos. 07/828,458 or 07/910,894, now U.S. Pat. Nos. 5,266,521 and 5,355,020, the Al depositing process is complicated. As a result, the throughput decreases or the conditions for forming a diffusion barrier layer become complicated. Therefore, the processing margin is narrowed, which is undesirable.

Dipankar Pramanik and Vivek Jain have announced their results of an experiment wherein an Al—1%Cu alloy is deposited on various kinds of underlayers al a temperature of 170° C. (see "Effect of Underlayers on Sputtered Aluminum Grain Structure and its Correlation with Step Coverage Submicron Vias," 1990 VMIC Conference, Jun. 12–13, pp.332–334). Dipankar et al. teach that the grain size of Al generated during the deposition varies depending on the kind of underlayer and the best step coverage can be obtained from a TiW film having the largest grain formation. This step coverage of Al is closely related to the size of the Al grains formed during deposition. That is, the larger the Al grain formed during deposition, the better the step coverage for Al layer contact holes or via hole. In addition, larger Al grains are formed during the deposition process when the wettability between the Al grains and the underlayer is better.

SUMMARY OF THE INVENTION

Accordingly, it is an object of the present invention to provide a semiconductor device wherein the characteristics of a diffusion barrier layer and the wettability between Al and the diffusion barrier layer are improved, thereby increase the mobility of Al grains formed by a deposition whereby the step coverage of a contact hole of a wiring layer is improved and/or the contact hole can be more easily filled.

It is another object of the present invention to provide a method for forming a reliable wiring layer which increases the mobility of Al atoms by improving the characteristics of a diffusion barrier layer, thereby improving the step coverage of the contact hole and completely filling the contact hole at the same time.

To accomplish the above objects of the present invention, there is provided a semiconductor device comprising a semiconductor substrate and a diffusion barrier layer formed on the semiconductor substrate. The diffusion layer having a silylation layer on its surface portion. The diffusion barrier layer may comprise of a refractory metal such as titanium, zirconium, tantalum or molybdenum, or of the refractory metal compounds thereof. The diffusion barrier layer is preferably a composite film comprising of a first diffusion barrier layer comprising a refractory metal and a second diffusion barrier layer comprising a refractory metal compound.

Additionally, according to an embodiment of the present invention, a third diffusion barrier layer comprised of a refractory metal compound may be formed on the silylation layer.

According to the present invention, there is provided a semiconductor device comprising: a semiconductor substrate; an insulating layer having a recessed portion formed on the semiconductor substrate; a diffusion barrier layer formed on the insulating layer and including a silylation layer; and a first metal layer which completely fills the recessed portion. The silylation layer may be formed on the surface of the diffusion barrier layer or on an intermediate region of the diffusion barrier layer.

The recessed portion is a contact hole which exposes the impurity-doped region of the semiconductor substrate, a via which exposes the lower conductive layer formed on the semiconductor substrate or a groove formed the insulating layer where a wiring layer pattern is to be formed.

According o the present invention, there is provided a method for manufacturing a semiconductor device comprising the steps of forming a diffusion barrier layer on a semiconductor substrate and forming a silylation layer on the diffusion barrier layer.

According to one embodiment of the present invention, the silylation layer can be formed by a plasma treatment wherein a silicon hydride is used. Examples of the silicon hydride include $SiH_4$ and $Si_2H_6$.

According to another embodiment of the present invention, the silylation layer can be formed by a reactive sputtering method that uses a silicon hydride.

After the diffusion barrier layer is formed, the silylation layer is formed successively without breaking the vacuum.

After the silylation layer is formed, a metal is deposited successively without breaking the vacuum, thereby forming a first metal layer on the silylation layer. The first metal layer can be formed by depositing Al or an Al alloy at a low temperature or by a high-temperature sputtering method.

As necessary, after the first metal layer is formed, the first metal layer is heat-treated at a high temperature below its melting point, thereby filling the recessed portions with the maleriai of the first metal layer. In addition to this, after the heat-treatment, a second metal layer can be formed on the first metal layer which fills up the recessed portion, and the second metal layer is preferably heat-treated at a high temperature below its melting point, thereby planarizing the surface of the second metal layer.

Accordingly, the step coverage of the metal layer is improved when the metal layer is deposited using the diffusion barrier layer of the present invention. Further, when this metal layer is heat-treated at a high temperature of 0.8 Tm to Tm (where Tm is the melting point of the metal), a metal layer which fills the contact hole more satisfactorily can be obtained easily.

After the metal layer is deposited, a heat-treatment process is performed successively without breaking the vacuum at a temperature of 0.8 Tm-Tm (where Tm is the melting point of the metal of the first metal layer). It is difficult to completely fill the recessed portion since the grains of the metal (Al alloy) layer cannot migrate sufficiently at a temperature of 0.8 Tm or below. Also, the metal (Al alloy) balls up because it may melt at a temperature above Tm, which is not desirable.

It is preferable to form a composite layer as a metal layer, by alternately depositing, a metal layer which includes a Si component and a metal layer which does not include a Si component. The metal layer without the Si component absorbs Si atoms from the metal layer including the Si component in the heat-treatment or sintering process, thereby preventing the formation of Si precipitates or Si nodules.

It is preferable to directly deposit the second metal layer without breaking the vacuum after the first metal layer is heat-treated, using the same sputtering equipment where the first metal layer has been processed. At this time, the temperature of depositing the second metal layer is below approximately 350° C. It is preferable to heat-treat the second metal layer to thereby planarize the surface of the second metal layer after the second metal layer is formed. This planarizing process can make the successive lithography process easier.

A wiring layer of the semiconductor device of the present invention can be manufactured easily by simply introducing the additional silicon hydride to the sputtering device of a conventional argon plasma.

The diffusion barrier layer formed by the method of the present invention has good wettability between the deposited Al. Therefore, when Al or an Al alloy is deposited by sputtering, the step coverage is excellent, thereby preventing formation of discontinuities on the sidewalls of an opening such as a contact hole or a via hole. Further, when heat-treating the deposited metal layer at a high temperature below the melting point to thereby fill up the opening with the material of the deposited metal layer, the reflow characteristic are improved, to thereby increase the filling of the opening. Additionally, an opening can be filled more completely.

In a wiring layer formed in accordance with the method of the present invention, a silylation layer is formed on an oxide film, while maintaining the oxide layer on the barrier layer. As a result, the stuffing effect can be maintained, and spiking phenomenon can be avoided (which occur in conventional techniques).

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

The present invention will now be described in more detail with reference to the accompanying drawings.

Figure 8:
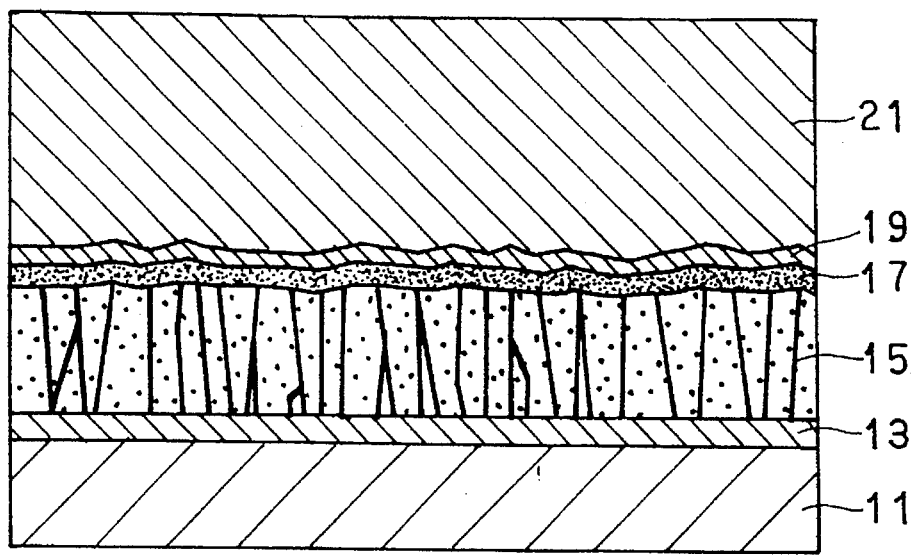
FIGS. 8–10 are cross-sectional views showing embodiments of the wiring layer of semiconductor device of the present invention.
Figure 9:
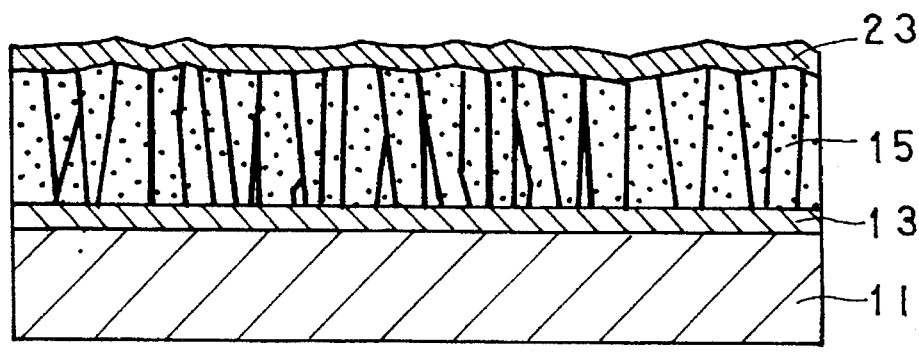
Figure 10:
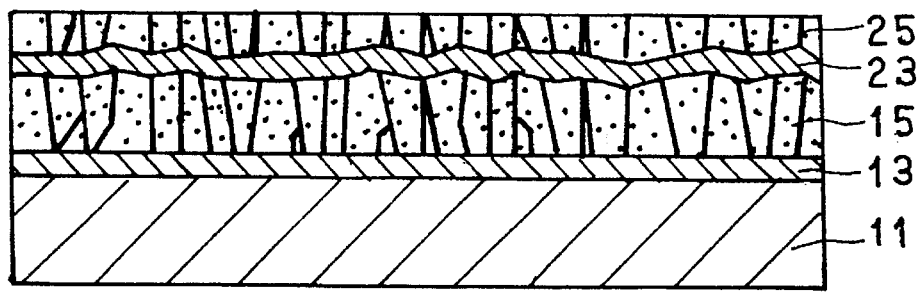

FIGS. 8–10 are cross-sectional views showing embodiments of the wiring layer of a semiconductor device constructed in accordance with the present invention.

FIG. 8 is a sectional view showing one embodiment of the wiring layer of the present invention.

Referring to FIG. 8, reference numeral 11 denotes a semiconductor substrate, reference numeral 13 denotes a first diffusion barrier layer comprising Ti, reference numeral 15 denotes a second diffusion barrier layer comprising of TiN, reference numeral 17 denotes an oxide layer on the surface of the second diffusion barrier layer 15, reference numeral 19 denotes a silylation layer obtained by silylating the surface portion of the oxide layer 17, and reference numeral 21 denotes an Al wiring layer.

The wiring layer shown in the structure of FIG. 8 is formed as follows.

First, a first diffusion barrier layer 13 is formed on a semiconductor substrate 11 by sputtering using Ti as a target. Then, a second diffusion barrier layer 15, comprising of TiN, is formed by depositing TiN according to a $N_2$ reactive sputtering method using the general Ti as a target, under an argon atmosphere. Then, in order to block the diffusion path of the Al and Si, an annealing process is performed at a temperature of 450° C. to 500° C., under a $N_2$ atmosphere for 30 to 60 minutes. During this time, an oxide layer 17 composed of $TiO_2$ or TiON is formed on the surface of the second diffusion barrier layer, by the oxygen stuffing effect. The wettability between the Al and the diffusion barrier layer is deteriorated due to the existence of oxide layer 17.

A silylation layer 19 is then formed by performing a silylation process the diffusion barrier layer, the oxide layer 17 is formed. Here, the silylation process can be performed by exposing the diffusion barrier layer to $SiH_4$ or $Si_2H_6$ plasma or to a Si* or SiH* radical by means of a silicon hydride. Preferably, the partial pressure of the silicon hydride is 0.5~15 mTorr, the power is 1~10 KW, and the substrate temperature ranges from room temperature to about 200° C. The vacuum of the silylation apparatus should be maintained at $5 \times 10^{-7}$ TORR or below when the silylation layer is formed. Silicon hydride produces the reactive radicals such as Si*, H*, SiH* or $SiH_2$* in the course or glow discharging or sputtering. During sputtering, by emitting the second electron, hydrogen prevents the semiconductor substrate from being damaged, thereby improving the electrical characteristics and reliability of the semiconductor device. Accordingly, it is preferable to add hydrogen at a pressure of 0~5 mTorr when the silylation process is performed. When, the hydrogen is added, the thickness of the silylation layer is changed since the oxide layer 17 of $TiO_2$ or TiON is reduced by the hydrogen radical.

Thus, by forming the silylation layer 19 the wettability between the diffusion barrier layer and Al is increased. As a result, not only the step coverage of the sputtered Al is enhanced, but also the diffusion path of Al and silicon is blocked, thereby preventing the occurrence of spiking.

After the silylation layer 19 is formed, a metal layer 21 for forming the wiring layer is formed by successively depositing Al or an Al alloy without breaking the vacuum.

FIG. 9 is a cross-sectional view showing another embodiment of the diffusion barrier layer formed below the wiring layer of the present invention.

Referring to FIG. 9, reference numerals 11, 13 and 15 denote the same elements as those of FIG. 8, and reference numeral 23 denotes a silylation layer formed by the reactive sputtering method of silicon hydride.

The diffusion barrier layer shown in FIG. 9 is formed as follows. First diffusion barrier layer 13 is formed on semiconductor substrate 11 in the same manner used with respect to FIG. 8. Then, under an atmosphere of argon of 2~7 mTorr and nitrogen of 1.5~5 mTorr (here, the partial pressure ratio of nitrogen to total pressure should be maintained at 40%), a second diffusion barrier layer 15 with a thickness of 500~1,000 Å is formed by depositing TiN at a substrate temperature of 200° C. and at a deposition rate of 300 Å–500 Å per minute, using Ti as the target. Then, $SiH_4$ is added at a partial pressure of 0.5~5 mTorr, and deposition is performed by a reactive sputtering method. As a result, a silylation layer 23 comprising of $TiN_xSi_y$(TiN—TiSi) is formed to have a thickness of 100~500 Å, and preferably 200 Å.

After the second diffusion barrier layer 15 is formed, the wafer 11 may be transferred to another reactive chamber without breaking the vacuum. Thereafter, silylation layer 23 can be formed by the reactive sputtering method.

Then, a metal layer (not shown) for forming a wiring layer is formed by successively depositing Al or Al alloy without breaking the vacuum.

When the vacuum is broken before the metal layer is formed, for example, when scrubbing is performed so as to remove the grain, the metal layer (not shown) for forming a wiring layer should be formed by successively depositing Al or Al alloy without breaking the vacuum after forming silylation layer 23 as shown in FIG. 8.

FIG. 10 is a cross-sectional view showing still another embodiment of the diffusion barrier layer formed below the wiring layer of the present invention.

Referring to FIG. 10, reference numerals 11, 13, 15 and 23 denote the same elements as those of FIG. 9, and reference numeral 25 is a third diffusion barrier layer composed of TiN formed on the silylation layer 23.

The diffusion barrier layer shown in FIG. 10 is formed by the following procedure.

First a diffusion barrier layer 13 is formed on the semiconductor substrate 11 using the same method used with respect to FIG. 8. Then, under an atmosphere of argon of 2~7 mTorr and nitrogen of 1.5~5 mTorr (here, the pressure ratio of nitrogen to total pressure should be maintained at 40%), a second diffusion barrier layer having a thickness of 500 Å is formed by depositing TiN at a substrate temperature of 200° C. and at a deposition rate of 300 Å–500 Å per minute, using Ti as the target. Then, $SiH_4$ is added at a partial pressure of 0.5~5 mTorr, and deposition is performed by a reactive sputtering method. As a result, a silylation layer 23 comprising of $TiN_xSi_y$(TiN—TiSi) is formed so as to have a thickness of 100~500 Å, and preferably 200 Å. After stopping the $SiH_4$ supply, a third diffusion barrier layer 25 having a thickness of 500 Å is formed by depositing TiN.

Then, the metal layer for forming a wiring layer is formed by successively depositing At or Al alloy without breaking the vacuum.

Using this method, a plurality of thin diffusion barrier layers comprised of silylation layer 23 and TiN layers can be formed.

Hereinafter, a method for filling up the contact hole using the diffusion barrier layer is explained in detail with reference to the above-described embodiments.

Embodiment 1

FIGS. 11–14 are schematic views showing an embodiment of a method forming a wiring layer of a semiconductor device according to the present invention.

Figure 11:
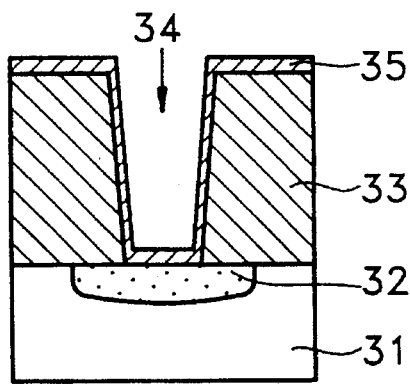
FIGS. 11–13 are schematic views showing an embodiment of a method for forming a wiring layer of a semiconductor device according to the present invention.

FIG. 11 shows the step of forming a diffusion barrier layer 35. In detail, an insulating layer 33 is formed on a semiconductor substrate 31 wherein an impurity doped region 32 is formed. The insulating layer 33, having a thickness of approximately 0.8~1.6 μm, is formed by using boro-phosphorus-silicate glass (BPSG). Then, a contact hole 34 which exposes a portion of the surface of an impurity doped region 32 of semiconductor substrate 31 is formed in the insulating layer 33. The diameter of the contact hole becomes smaller as it atoproaches the substrate, and larger in the opposite direction. The largest diameter of the upper part is approximately 0.5~1.0 μm, while the smallest diameter (towards the substrate) is approximately 0.3~0.7 μm. Diffusion barrier layer 35 is then formed on the entire surface of the insulating layer 33 and on the inner sidewall of the contact hole 34 and on the exposed surface of the semiconductor substrate 31. The diffusion barrier layer 35 is formed by the following procedure, as shown in FIG. 8. First, titanium (Ti) having a thickness of 100~300 Å is deposited by a sputtering method under an argon atmosphere, thereby forming a first diffusion barrier layer. Then, under an argon atmosphere of 7 mTorr with a 40% $N_2$ relative partial pressure, a second diffusion barrier layer is formed by depositing titanium nitride to a thickness of approximately 300~1,000 Å, using the sputtering method. At this time, the temperature of the substrate stays at 200° C. when Ti or TiN is deposited. Diffusion barrier layer 35 is annealed at the temperature of 450°~500° C. for 30 to 60 minutes under an $N_2$ atmosphere. At this time, a small amount of oxygen is introduced, and an oxide layer (not shown) such as $TiO_2$, TiO or $Ti_2O_3$ is formed on the surface of the diffusion barrier layer, as shown in FIG. 8.

Figure 12:
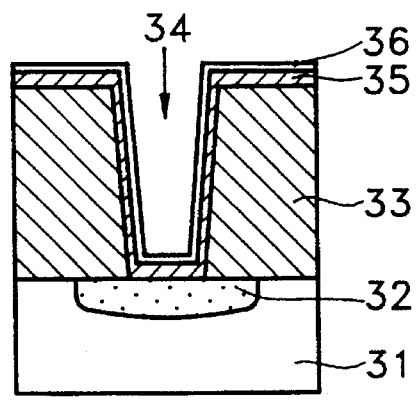

FIG. 12 shows a silylation process of the diffusion barrier layer 35. The silylation process is performed on the diffusion barrier layer 35, obtained as described above, as explained with reference to FIG. 8. Then, a silylation layer 36 is formed on the surface where an oxide layer is formed, as shown in FIG. 8.

Figure 13:
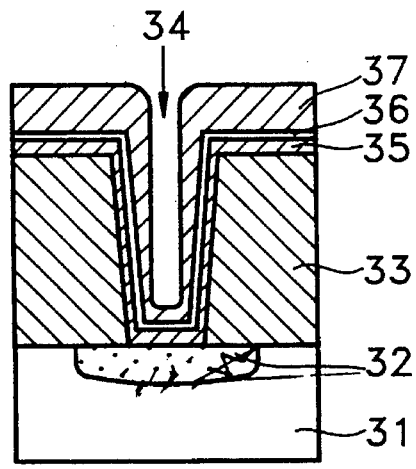

FIG. 13 shows the step of forming a first metal layer 37. After forming silylation layer 36, and then substrate 31 is transferred to another reactive chamber without breaking the vacuum and a first metal layer 37 is formed by depositing a first metal on silylation layer 36, at a low temperature under a vacuum. The first metal layer 37 may be timned as a single layer using Al—0.4%Si—0.5%Cu as a target. The first metal layer may be formed as a composite layer using Al—Si alloy (Al—1%Si alloy) or an Al alloy which includes an Si component, for example Al—0.5%Cu—1%Si alloy, or pure Al or an Al alloy which has no Si component, for example, Al—Cu alloy (Al—0.5Cu alloy) or Al— Ti alloy, as the target. The first metal layer is preferably formed as a composite layer comprising the metal layer with a Si component and the metal layer without Si. The first metal is deposited at a low temperature of 200° C. or below, under an argon atmosphere below 4 mTorr (preferably, 2 mTorr) and by sputtering method at a deposition rate of 100–150 Å per second, and preferably, at rate of 120 Å/sec. At this time, power is 5~7.2 KW.

The preferable thickness of the first metal layer 37 is 4,000~6,000 Å. The thus-obtained first metal layer 37 has large Al grains since the wettability is increased between the diffusion barrier layer and the deposited Al. Accordingly, the reliability of the wiring of the semiconductor device is enhanced since he step coverage of the wiring layer is increased. The first metal layer is patterned and used as a wiring layer of the semiconductor device. If necessary, the first metal layer is heat-treated and contact hole 34 is filled after forming first metal layer 37. A wiring layer (not shown) of the semiconductor device can be formed after additionally depositing a second metal layer (not shown).

Embodiment 2

Figure 14:
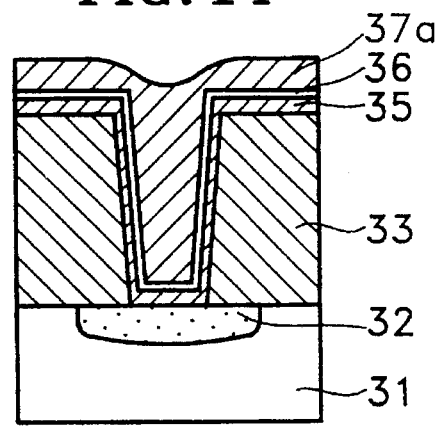
FIGS. 14–16 are schematic views showing an embodiment of a method for filling an opening according to the method of the present invention.
Figure 15:
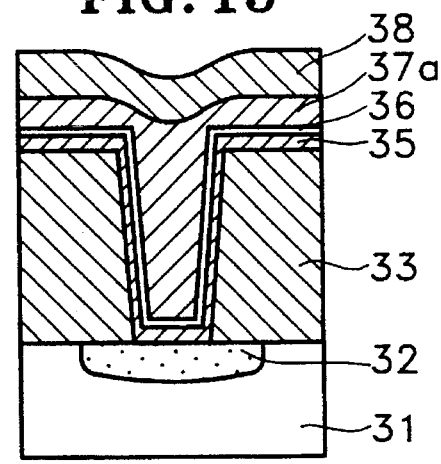
Figure 16:
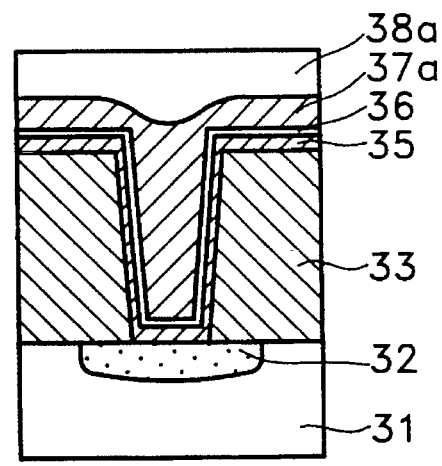

FIGS. 14–16 are schematic views showing an embodiment of a method for filling an opening according to the method of the present invention. Here, the same reference numerals denote the same elements of Embodiment 1.

FIG. 14 shows the step of filling contact hole 34 with the metal of the first metal layer 37. In more detail, the first metal layer 37 is formed in the same manner as in Embodiment 1 except that the first metal layer 37, having a thickness of 500~3,000 Å, is formed in the step corresponding to FIG. 13 of Embodiment 1. Then, the semiconductor substrate is moved into another chamber (not shown) without breaking vacuum, and the first metal layer 37 is heat-treated at a temperature of 500°~550° C. for one to five minutes using an argon conduction method. Consisting the atoms of Al or an Al alloy to migrate into the contact hole 34. The migration of Al atoms decreases its free energy, and subsequently decreases the surface area, thereby completely filling the contact hole 34 with the metal of the first metal layer. This heat-treatment can be changed depending on such conditions as the exposure time to the environment (or atmosphere) after the first metal layer formation, the amount of oxidant introduced during the depositing of the first metal layer, and the introduced amount of oxidant (including humidity) of the deposition equipment. Here, for example, the temperature will be lower with less introduced oxidant and a shorter exposure time, and the heat-treatment temperature may be reduced for higher vacuums. This heat treatment can be performed in an atmosphere of inert gas (for example, $N_2$ or Ar) or reductive gas (for example, $H_2$). Instead of the argon conduction method, other heat-treatment methods such as rapid thermal annealing (RTA) or ramp heating can be used. These heat-treatment methods can be used alone or in combination with another method. Referring to FIG. 14, reference numeral 37a is a first metal layer which completely fills tip the contact hole.

FIG. 15 shows the step for forming a second metal layer 38 on the heat-treated first metal layer 37a. In more detail, at a temperature of 350° C. or below and without breaking the vacuum, a metal is deposited by a sputtering method so as to form a wiring layer having a predetermined thickness, and thereby forming a second metal layer having a thickness of 3,000~5,500 Å. As the metal of second metal layer 38, a metal without a Si component, for example, an Al—Cu alloy (Al—0.5% Cu alloy) or Al—Ti alloy is used when the first metal layer includes an Si component. When the lower layer does not include a Si component, a metal with a Si component, for example, an Al—Si alloy (Al—1% Si alloy) or an Al—Cu—Si alloy (Al—0.5% Cu—1% Si alloy) can be used.

Second metal layer 38 can be formed simultaneously with the heat treatment of the first metal layer. For example, after the first metal layer having a thickness of 500~3000 Å is formed in the step corresponding to FIG. 13, the second metal layer is deposited without breaking the vacuum, having maintained the substrate at a temperature of heater of 500°~550° C. Then, after the first metal layer is heat-treated to fill contact hole 34, the second metal layer is formed.

FIG. 16 shows the step of planarizing the surface of the wiring layer by heat-treating second metal layer 38. Reference numeral 38a indicates the heat-treated second metal layer. The step of planarizing the surface of the wiring layer is performed in the same manner as in the case of the first metal layer without breaking the vacuum. Atoms of the second metal layer migrate into contact hole 34 by performing this step, which fill contact hole 34 more completely, thereby generating a planarized wiring layer. Accordingly, the successive photolithography process can be performed more easily and effectively. Then, a anti-reflective layer (not shown) is formed by depositing a nitride titanium having a thickness of 200~500 Å on the surface of the heat-treated second metal layer 38a using the sputtering method so as to improve the successive photolithography process. After the anti-reflective layer is formed, a predetermined resist pattern (not shown) is formed on the anti-reflective layer via a conventional photolithography process, so as to form a wiring pattern of a semiconductor device. Then, the anti-reflective film, the planarized second metal layer 38a, the first metal layer 37a, and the diffusion barrier layer 35 having the silylation layer 36 are etched in succession, thereby completing a wiring layer of the present invention.

Embodiment 3

Here, the diffusion barrier layer is formed using the same method as that corresponding to FIG. 11 of Embodiment 1, except that the diffusion barrier layer is formed as shown in FIG. 9 of Embodiment 1.

In more detail, the insulating layer having a thickness of 0.8~0.5 μm is formed using BPSG on the semiconductor wafer wherein the impurity doping region is formed. Then, the contact hole (for example, 0.7 μm×0.7 μm) having a stepped portion on the upper part thereof is formed, to expose, the impurity doped region of the semiconductor substrate.

After forming the contact hole, the first diffusion barrier layer comprising Ti is formed on the inner sidewall of the contact hole, on the insulating layer and on the exposed surface of the semiconductor substrate, using the same method as that corresponding to FIG. 8. Then, using a reactive sputtering method, TiN is deposited on the first diffusion barrier layer using Ti as a target, under the conditions explained with reference to FIG. 9, thereby forming a second diffusion barrier layer having a thickness of 500~1,000 Å. $SiH_4$ is then added at a pressure of 0.5~5 mTorr and, deposition is performed by the reactive sputtering method. As a result, a silylation layer composed of $TiN_xSi_y$(TiN—TiSi) is formed to a thickness of 100~500 Å, and preferably, 200 Å.

The silylation layer can be formed by the reactive sputtering method after the second diffusion barrier layer is formed and the wafer is transferred to another reactive chamber without breaking the vacuum.

Thus, when the silylation layer is formed on the diffusion barrier layer, the diffusion path of the silicon and metal atoms is blocked.

Then, Al or an Al alloy is successively deposited on the diffusion barrier layer without breaking the vacuum using the same method as that of FIG. 13 of Embodiment 1, thereby forming a first metal layer for forming a wiring layer.

In addition to this, when the vacuum is desired to be broken before the metal layer is formed. Al or an Al alloy is deposited successively without breaking the vacuum after the silylation layer is formed and silylated again, to thereby form a metal layer for forming a wiring layer. When the metal layer is formed, the wettability between the metal layer and the diffusion barrier layer is enhanced to thereby form the metal layer which has large Al grains and to prevent void formation. Additionally, the step coverage is improved and as a result, the reliability of the wiring layer of the semiconductor device is enhanced.

Then, the contact hole is completely filled with the first metal layer, having kept the semiconductor wafer at a temperature of 0.8 Tm to Tm, without breaking the vacuum using the same method as that described with respect to Embodiment 2. As necessary, after the second metal layer is formed additionally on the first metal layer which fills the contact hole, in the same manner used in Embodiment 2, heat treatment can be performed again.

Then, after forming an anti-reflective film, the wiring layer of the present invention can be obtained through a photolithography process for forming the metal wiring layer, using the same method used in Embodiment 2.

Embodiment 4

The diffusion barrier layer is formed by the same method used in FIG. 11 of Embodiment 1, except that the diffusion barrier layer is formed as shown in FIG. 10.

In more detail, the insulating layer having a thickness of 0.8~1.5 μm is formed on the semiconductor substrate wherein an impurity doped region is formed, using BPSG. Then, the contact hole (for example, 0.7 μm×0.7 μm) having a stepped portion on the upper part thereof is formed, thereby exposing the impurity doped region of the semiconductor substrate.

After the contact hole is formed, the first diffusion barrier layer comprising Ti is formed on the inner surface of the contact hole, on the insulating layer and on the exposed surface the semiconductor substrate, using the same method as that of FIG. 8. Then, using a reactive sputtering method, TiN is deposited on the first diffusion barrier layer using Ti as a target, under the conditions explained with respect to FIG. 10, thereby forming a second diffusion barrier layer having a thickness of 500~1,000 Å. $SiH_4$ is then added at a pressure of 0.5~5 mTorr, which is then deposited by the reactive sputtering method. As a result, the silylation layer comprising of $TiN_xSi_y$(TiN—TiSi) is formed to the thickness of 100~500 Å, and preferably, 200 Å. Then, a third diffusion barrier layer having a thickness of 500 Å is formed by stopping the supply of $SiH_4$ and re-depositing TiN.

Then, the metal layer for forming the wiring layer is formed by successively depositing Al or an Al alloy, without breaking the vacuum.

Thus, a plurality of thin diffusion barrier layers consisting of the silylation layer and TiN can be formed.

When the silylation layer is thus formed on the diffusion barrier layer, the spiking phenomenon which may be generated during an Al wiring process can be prevented without undergoing a heat treatment of the diffusion barrier layer or an additional nitrogen annealing process, since the diffusion path of the silicon and metal atoms is blocked and the silylation layer is formed between the diffusion barrier layers as an intermediate layer.

Then, Al or an Al alloy is successively deposited on the diffusion barrier layer without breaking the vacuum, using the same method explained in FIG. 13 of Embodiment 1, thereby forming a first metal layer for forming a wiring layer.

In addition to this, when the vacuum is desired to be broken before the metal layer is formed, Al or an Al alloy should be deposited successively without breaking the vacuum after the silylation layer is formed and silylated again, to thereby form a metal layer for forming a wiring layer. When the metal layer is formed, the wettability between the metal layer and the diffusion barrier layer is enhanced to thereby form the metal layer having large Al grains and to prevent the forming of a void, in the same way as shown in embodiments 1, 2 and 3. Additionally, the step coverage is improved and, as a result, the reliability of the wiring layer of the semiconductor device is enhanced.

Then, the contact hole is completely filled with the first metal layer, having kept the semiconductor wafer at a temperature of 0.8 Tm to Tm, without breaking the vacuum using the same method with that of Embodiment 2. As necessary, after the second metal layer is formed additionally on the first metal layer which fills up the contact hole, in the same manner in Embodiment 2, the heat treatment can be performed again.

Then, after forming an anti-reflective film, the wiring layer of the present invention can be obtained through a photolithography process for forming the metal wiring layer, using the same method used in Embodiment 2.

Embodiment 5

Figure 17:
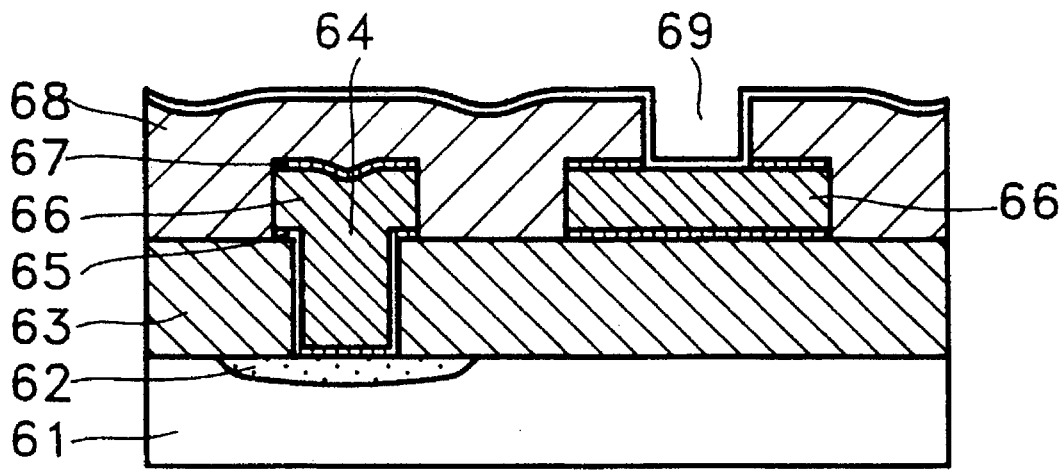
FIGS. 17 and 18 illustrate another embodiment of a method for forming a wiring layer of a semiconductor device according to the present invention.
Figure 18:
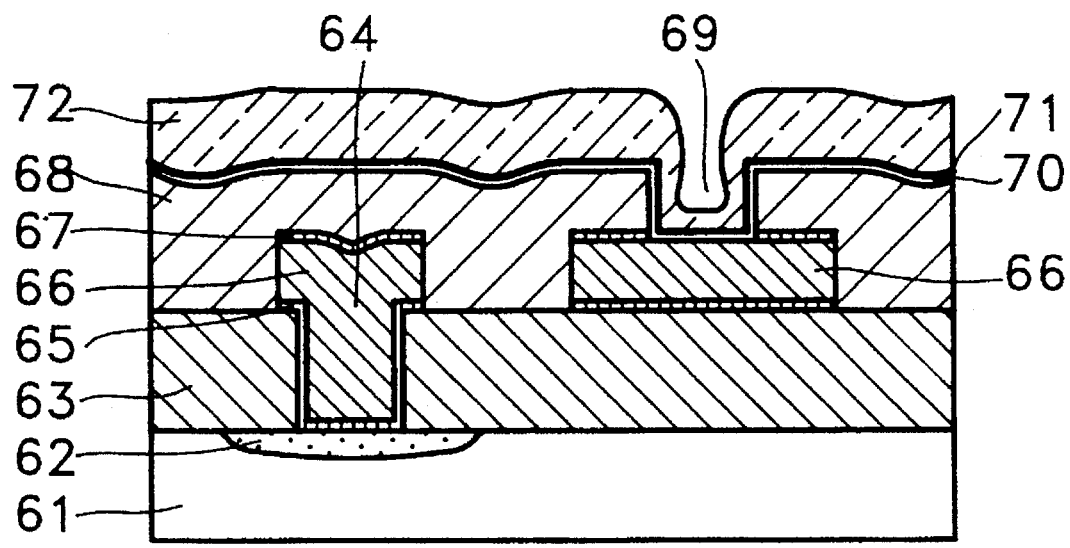

FIG. 17 and FIG. 18 show another embodiment of a method for forming a wiring layer of a semiconductor device according to the present invention.

FIG. 17 shows the steps of forming a via hole 69 and a diffusion barrier layer. In more detail, a first insulating layer 63 having a thickness of 0.8~1.5 μm is formed using BPSG, on a semiconductor substrate 61 wherein an impurity doped region 62 is formed. Then, a contact hole 64 (for example, 0.7 μm×0.7 μm) for electrically connecting a lower wiring layer 66 with the impurity doped region 62 of the semiconductor substrate 61 is formed in the first insulating layer 63. Then, impurity doped region 62 of semiconductor substrate 61 is exposed, and diffusion barrier layer 65 is formed by the method shown in the Embodiments 1 through 4 and in FIGS. 8, 9 and the 10, and lower wiring layer 66 and an anti-reflective film 67 are formed. Then, a second insulating layer 68 comprised of SiO$_2$ is formed on the lower wiring layer 66, and a via hole 69 whose size is below 1.0 μm×1.0 μm is formed in the second insulating layer 68.

Figure 1:
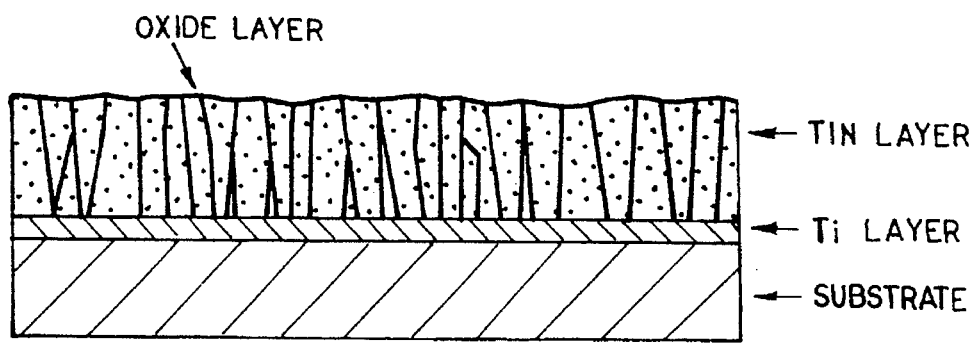
FIG. 1 is a cross-sectional view showing an oxide layer formed on the surface of a diffusion barrier layer, after the diffusion barrier layer is formed and when the vacuum is broken.
Figure 2:
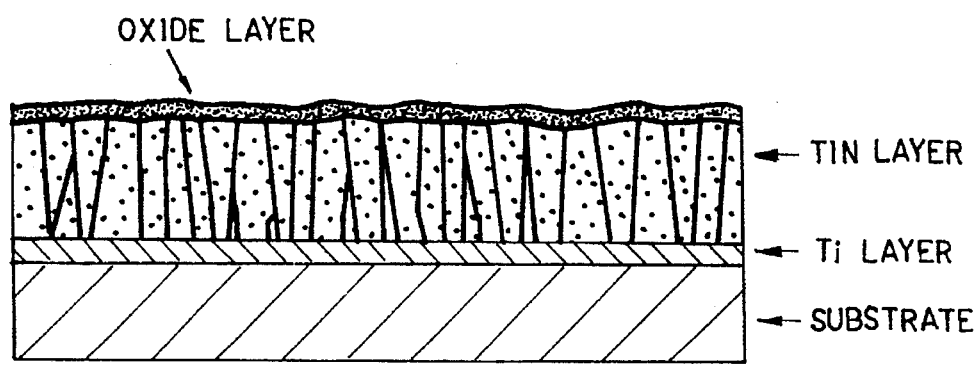
FIG. 2 is a cross-sectional view showing the status of a oxide layer formed on the surface of the diffusion barrier layer, after a diffusion barrier layer is formed and wherein a diffusion barrier characteristic is enhanced by $N_2$ annealing.
Figure 3:
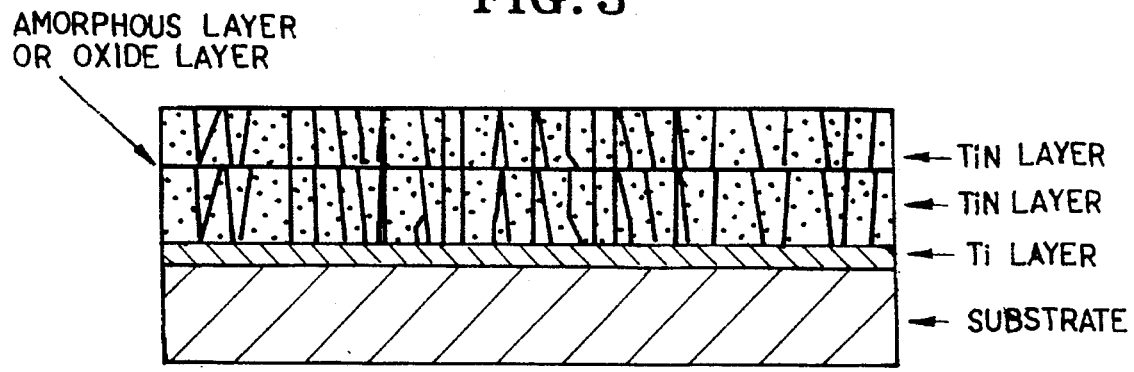
FIG. 3 is a sectional view showing a diffusion barrier layer obtained by forming a first diffusion barrier layer and then forming a second diffusion barrier layer on the first diffusion barrier layer after ion-implanting the first diffusion barrier layer or nitrogen annealing the first diffusion barrier layer.
Figure 4:
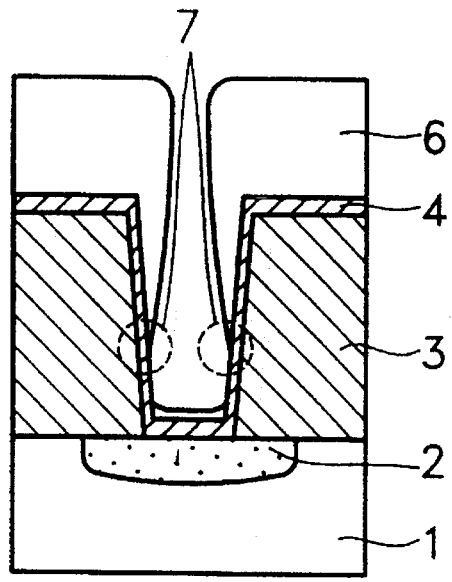
FIGS. 4–6 show a poor wiring layer which can be generated when Al is deposited on a conventional diffusion barrier layer to form a metal layer and then the metal layer is heat-treated to thereby fill a contact hole.
Figure 5:
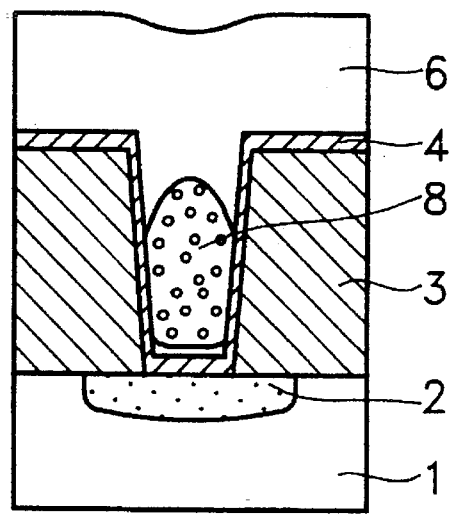
Figure 6:
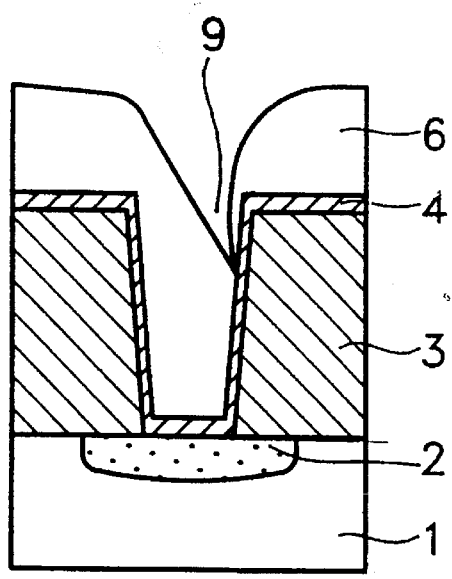
Figure 7:
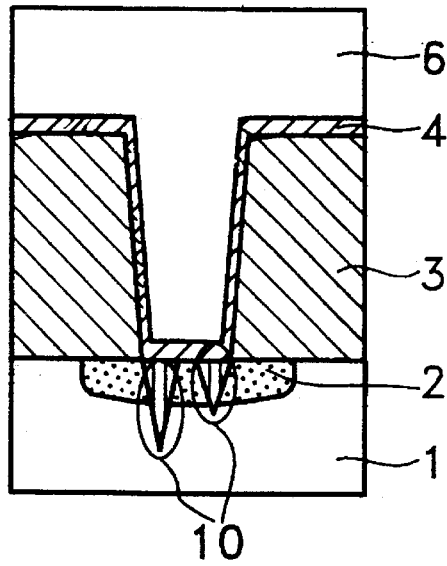
FIG. 7 is a sectional view showing Al spiking generated from conventional techniques.

After the via hole 69 is formed, a diffusion barrier layer 70 is formed on the insulating film 68, on the inner surface of the via hole 69 and on the exposed lower wiring layer, using the same method as that of Embodiment 1. Then, the surface of the diffusion barrier layer is silylated to thereby form a silylation layer 71. When the diffusion barrier layer is not formed or when a conventional diffusion barrier layer is used, the surface of the insulating film comprised of SiO$_2$ or the oxide layer is formed on the surface region of the conventional diffusion barrier layer as shown in FIG. 2. Therefore, the wettability between the insulating layer and the metal layer becomes poor when the metal layer is formed by a sputtering method. As a result, the step coverage of the metal layer for via hole becomes poor; specifically, on the sidewalls of the via hole. After forming the diffusion barrier layer on the insulating layer which includes the via hole, and when the silylation layer is formed, as in the present invention, the tipper metal layer having a good profile which has no disconnection on the sidewall can be obtained in the subsequent metal processing, since the wettability between the diffusion barrier layer and the sputtered metal is good when depositing.

FIG. 18 shows the step of forming an upper metal layer 72. In more detail, upper metal layer 72 is formed by depositing an Al—Si—Cu alloy (Al—1%Si—0.5%Cu alloy) or an Al—Cu or Al—Si alloy to a thickness of approximately 8,000 Å without breaking the vacuum after the silylation process, using a sputtering method. At this time, the upper metal layer is deposited at a deposition rate of 150 Å/sec or slower and at a temperature of 200° C. or below, using the same method as that of Embodiment 1. When the upper metal layer 72 is formed, the metal atoms of the upper metal layer 72 migrate to the inside of the via hole 69, since the wettability between the upper metal layer 72 and the insulating film 68 is enhanced, thereby forming a metal layer having large Al grains. As a result, the step coverage of the upper metal layer 72 is increased, and the reliability of the via hole 69 is improved.

Then, the upper metal is heat-treated using the same method as that of Embodiment 2, thereby filling up via hole 69 with the material the upper metal layer.

When the upper metal layer is formed thinly and heat-treated so as to fill via hole 69, all other second metal layer can be formed on the upper metal layer which fills via hole 69. This second metal layer is heat-treated in similar manner as that of Embodiment 2 so as to have a planarized surface. Then, after forming an anti-reflective film, the wiring layer of the present invention call be obtained via a photolithography process for forming the upper metal layer.

Embodiment 6

Figure 19:
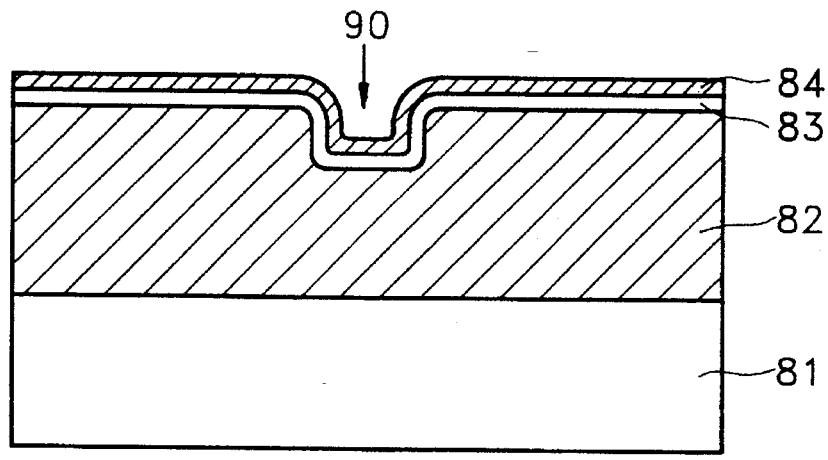
FIGS. 19–21 are schematic views showing another embodiment of a method for forming a wiring layer of a semiconductor device according to the present invention.
Figure 20:
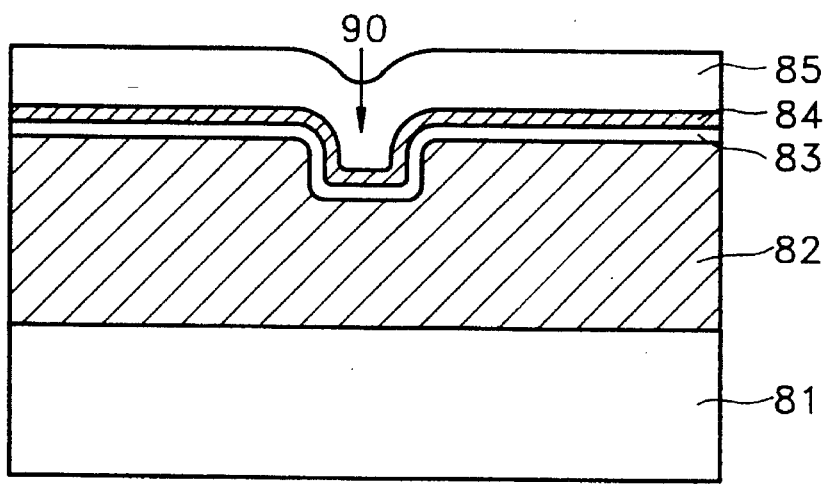
Figure 21:
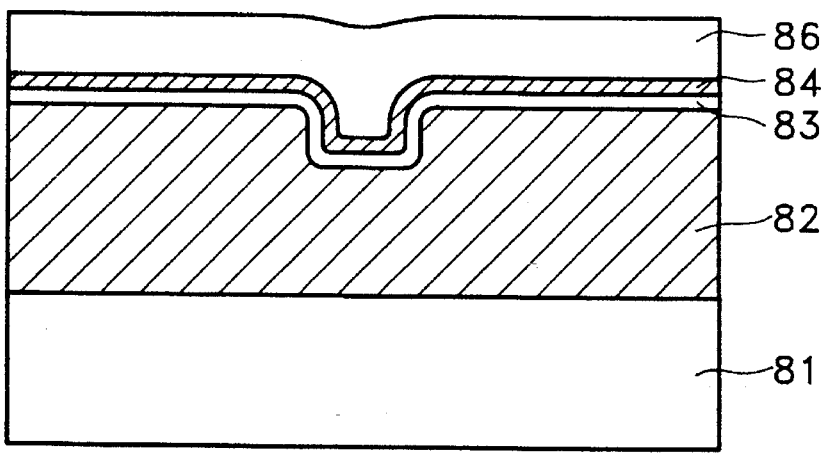

FIGS. 19–21 are schematic views showing another embodiment of the method for forming the wiring layer of the semiconductor device according to the present invention.

FIG. 19 shows the step of forming a groove 90 and a diffusion barrier layer 83. In detail, an insulating interlayer 82 having a thickness of 1.5 μm is formed on a semiconductor substrate 81 using BPSG. Then, the groove whose depth is 0.3~0.7 μm is formed in the region of the semiconductor device where the wiring layer is expected to be formed using a conventional photolithography process.

Then, diffusion barrier layer 83 is formed on the inner surface of the groove 90 and on the insulating interlayer 82 and, the surface of the above diffusion barrier layer is silylated using the same method as that of Embodiment 1, to thereby form a silylation layer 84. When the diffusion barrier layer is not formed, the surface of the insulating film is comprised of SiO$_2$ or an oxide layer is formed on the surface of the conventional diffusion barrier layer, as shown in FIG. 2.

Accordingly, where no silylation layer is found, and the metal layer is formed by the sputtering method directly on the surface of the insulating layer, the size of the grain of the formed metal layer becomes small since the wettability between the metal layer and the insulating layer is poor.

In the present invention, by contrast, after the diffusion barrier layer is formed on the insulating film which includes the via hole, a silylation layer is formed, thus causing, the size of the grain of the formed metal layer to become large in the subsequent metal processing, since the wettability between the diffusion barrier layer and the sputtered metal is good upon depositing.

FIG. 20 shows the step of forming a metal layer 85.

In more detail, the metal layer 85 is formed by depositing an Al—Si—Cu alloy (Al—1%Si—0.5%Cu alloy) or an Al—Cu or Al—Si alloy to a thickness of approximately 8,000 Å without breaking the vacuum after the silylation process, using sputtering method. At this time, the metal layer 85 is deposited at a the deposition rate of 150 Å/sec or slower and at a temperature of 200° C. or below, using the same method as that of Embodiment 1. When the metal layer 85 is formed, the wettability between the metal layer 85 and insulating interlayer 82 is enhanced, thus forming the metal layer which has large Al grains. As a result, the step coverage of the groove 90 is good.

Then, using the same method as that of Embodiment 2, the metal layer 85 is heat-treated and the groove 90 is filled with the material of the metal layer 85, so as to planarize the surface of metal layer 85.

Then, after forming an anti-reflective layer, the wiring layer of the present invention can be obtained through a photolithography process for forming the metal wiring layer or by a chemical-mechanical polishing process. The wiring layer formed by the method of the present invention has good electron mobility and is stress resistant. Therefore, the reliability of the wiring layer formed by the method of the present invention is remarkably enhanced as compared with the conventional wiring layer which is sputtered and patterned.

The wiring layer of the semiconductor device of the present invention can be manufactured easily by performing the process where silicon hydride is simply introduced to the conventional sputtering device of argon plasma. Accordingly, the wiring layer of the present invention can be manufactured easily by simply changing the equipment.

In addition to this, throughput is improved since the wiring layer of the present invention can be easily formed by adding silicon hydride when the diffusion barrier layer is formed. Simultaneously, the number of chamber transfers is decreased, thereby increasing yield.

The diffusion barrier layer generated by the method of the present invention has good wettability between the deposited Al. Therefore, the step coverage is excellent when Al or an Al alloy is deposited by a sputtering method. Also, the discontinuity on the sidewalls of an opening (a contact hole or a via hole) are not generated, and the reflow characteristic is improved when the opening is filled with a metal layer by heat-treating at a high temperature below the melting point after the deposition. As a result, the filling of the opening is increased. Moreover, the aperture can be filled more completely.

The wiring layer formed by the method of the present invention can suppress the spiking phenomenon the same as the conventional technique, since the silylation layer is timned while remaining the oxide layer on the barrier layer, thereby maintaining the stuffing effect.

In addition to this, when the silylation layer is formed at an intermediate diffusion barrier layer, the silylation layer blocks the diffusion path of the metal atoms or the silicon atoms. Therefore, the characteristics of the diffusion barrier layer can be maintained, which enables depositing the metal without performing an additional heat-treating or nitrogen annealing process to the diffusion barrier layer.

According to the conventional technique, a sintering step after the Al deposition or burial process is essential. This sintering step is performed under a nitrogen atmosphere including hydrogen gas. However, for the case the wiring layer of the semiconductor device of the present invention or the semiconductor device which includes the wiring layer which is formed by the wiring forming method of the present invention, the hydrogen radical or hydrogen gas is generated when the plasma processing is performed using silicon hydride, and is included in the metal layer and the lower portion of the substrate. The sintering process is unnecessary since the passivation process exists after the metal layer is formed, and the subsequent process will suffice.

Therefore, according to the present invention, the yield and reliability of a wiring layer of a semiconductor device are improved as compared with convention al techniques. Also, throughput is enhanced, thereby enabling manufacturing the semiconductor device at a low price.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a semiconductor device comprising the steps of:

forming a first diffusion barrier layer comprised of a refractory metal on a semiconductor substrate:

forming a second diffusion barrier layer comprised of a refractory metal compound on said first diffusion barrier layer;

forming a silylation layer on said second diffusion barrier layer; and forming a third diffusion barrier layer comprised of a refractory metal compound on said silylation layer.

2. A method for manufacturing a semiconductor device, comprising the steps of:

depositing a refractory metal on a semiconductor substrate, to thereby form a first diffusion barrier layer;

depositing a refractory metal compound on said first diffusion barrier layer, to thereby form a second diffusion barrier layer, wherein said first and second diffusion barrier layers comprise a composite layer;

forming a silylation layer on said composite layer; and depositing a refractory metal compound on said silylation layer to thereby form a third diffusion barrier layer.

3. A method for manufacturing a semiconductor device, comprising the steps of:

depositing a refractory metal on a semiconductor substrate, to thereby form a first diffusion barrier layer;

depositing a refractory metal compound on said first diffusion barrier layer, to thereby form a second diffusion barrier layer, wherein said first and second diffusion barrier layers comprise a composite layer; and, forming a silylation layer on said composite layer by means of a plasma treatment process, using silicon hydride.

4. A method for manufacturing a semiconductor device, comprising the steps of:

depositing a refractory metal on a semiconductor substrate, to thereby form a first diffusion barrier layer;

depositing a refractory metal compound on said first diffusion barrier layer, to thereby form a second diffusion barrier layer, wherein said first and second diffusion barrier layers comprise a composite layer; and, forming a silylation layer on said composite layer by means of a reactive sputtering process, using silicon hydride.

5. The method as set forth in claim 2, further comprising the step of depositing a first metal layer on said third diffusion barrier layer.

6. The method as set forth in claim 5, further comprising the step of forming a second metal layer on said first metal layer.

7. The method as set forth in claim 6, wherein said first metal layer is comprised of a metal selected from a group consisting of aluminum and aluminum alloys.

8. The method as set forth in claim 7, wherein said second metal layer is comprised of a metal selected from a group consisting of aluminum and aluminum alloys.

9. The method as set forth in claim 3, further comprising the step of forming a metal layer on said silylation layer.

10. The method as set forth in claim 4, further comprising the step of forming a conductive interconnection layer on said silylation layer.

11. A method for manufacturing a semiconductor device, comprising the steps of:

forming an insulating layer on a semiconductor substrate;

forming a contact hole in said insulating layer to expose an impurity doped region of said semiconductor substrate;

forming a first diffusion barrier layer on said exposed impurity doped region of said semiconductor substrate and walls of said insulating layer defining said contact hole;

forming a second diffusion barrier layer on said first diffusion barrier layer;

forming a silylation layer on said second diffusion barrier layer; and, forming a third diffusion barrier layer on said silylation layer.

12. The method as set forth in claim 11, wherein said first diffusion barrier layer is comprised of a refractory metal and said second diffusion barrier layer is comprised of a refractory metal compound.

13. The method as set forth in claim 12, wherein said first and second diffusion barrier layers together comprise a composite barrier layer.

14. The method as set forth in claim 12, wherein said third diffusion barrier layer is comprised of a refractory metal compound.

15. The method as set forth in claim 11, further comprising the step of forming a metal layer on said third diffusion barrier layer.

16. The method as set forth in claim 11, further comprising the step of forming a conductive interconnection layer on said third diffusion barrier layer.

17. A method for manufacturing a semiconductor device, comprising the steps of:

forming an insulating layer on a semiconductor substrate;

forming a contact hole in said insulating layer to expose an impurity doped region of said semiconductor substrate;

forming a first diffusion barrier layer on said exposed impurity doped region of said semiconductor substrate and walls of said insulating layer defining said contact hole;

forming a second diffusion barrier layer on said first diffusion barrier layer;

forming an oxide layer on said second diffusion barrier layer;

forming a silylation layer on said oxide layer.

18. The method as set forth in claim 17, wherein said forming an oxide layer step is carried out by a process of annealing said second diffusion barrier layer.

19. The method as set forth in claim 18, wherein said annealing process is performed at a temperature of 450° C.–500° C., under a $N_2$ atmosphere, for a period of 30–60 minutes.

20. The method as set forth in claim 19, wherein said first diffusion barrier layer is comprised of a refractory metal and said second diffusion barrier layer is comprised of a refractory metal compound.

21. The method as set forth in claim 20, further comprising the step of forming a metal layer on said silylation layer.

22. The method as set forth in claim 20, further comprising the step of forming a conductive interconnection layer on said silylation layer.

23. The method as set forth in claim 20, further comprising the step of forming a third diffusion barrier layer on said silylation layer.

24. The method as set forth in claim 23, wherein said third diffusion barrier layer is comprised of a refractory metal compound.

25. The method as set forth in claim 23, further comprising the step of forming a metal layer on said third diffusion barrier layer.

26. The method as set forth in claim 23, further comprising the step of forming a conductive interconnection layer on said third diffusion barrier layer.

27. The method as set forth in claim 17, wherein said forming a silylation layer step is Carried out by means of a plasma treatment process, using silicon hydride.

28. The method as set forth in claim 17, wherein said forming a silylation layer step is carried out by means of a reactive sputtering process, using silicon hydride.

29. The method as set forth in claim 28, wherein said silicon hydride is introduced at a partial pressure of 0.5–5 mTorr.

30. The method as set forth in claim 27, wherein said silicon hydride is introduced at a partial pressure of 0.5–15 mTorr, and said plasma treatment process is carried out at a power level of 1–10 kW, in a vacuum of $5\times10^{-8}$ Torr or below, and with said semiconductor substrate at a temperature of between room temperature and 200° C.

31. The method as set forth in claim 30, further comprising the step of, during said plasma treatment process, adding hydrogen at a pressure of 0–5 mTorr.

* * * * *